United States Patent
Gosselin et al.

(10) Patent No.: US 10,021,810 B2
(45) Date of Patent: Jul. 10, 2018

(54) VENTILATING SYSTEM FOR AN ELECTRICAL EQUIPMENT CABINET AND ASSOCIATED METHODS

(71) Applicants: Daniel Gosselin, Harrisville, RI (US); Lars R. Larsen, Old Lyme, CT (US); Rudolph A. Montgelas, West Hartford, CT (US); Ryan J. Grandidge, Westerly, RI (US)

(72) Inventors: Daniel Gosselin, Harrisville, RI (US); Lars R. Larsen, Old Lyme, CT (US); Rudolph A. Montgelas, West Hartford, CT (US); Ryan J. Grandidge, Westerly, RI (US)

(73) Assignee: Ortronics, Inc., New London, CT (US)

( * ) Notice: Subject to any disclaimer, the term of this patent is extended or adjusted under 35 U.S.C. 154(b) by 792 days.

(21) Appl. No.: 13/934,479

(22) Filed: Jul. 3, 2013

(65) Prior Publication Data

US 2014/0011437 A1 Jan. 9, 2014

Related U.S. Application Data

(60) Provisional application No. 61/669,217, filed on Jul. 9, 2012.

(51) Int. Cl.
*F24F 11/76* (2018.01)
*H05K 7/20* (2006.01)

(52) U.S. Cl.
CPC ..... *H05K 7/20209* (2013.01); *H05K 7/20836* (2013.01)

(58) Field of Classification Search
CPC ........... B64D 2013/003; B60H 1/3442; B60H 1/3428; B60H 1/3435; F24F 13/065; H05K 7/20209; H05K 7/20836

(Continued)

(56) References Cited

U.S. PATENT DOCUMENTS

| | | | |
|---|---|---|---|
| 5,000,160 A * | 3/1991 | Dunlop | F24C 15/2042 126/299 D |
| 6,514,138 B2 | 2/2003 | Estepp | |
| 6,745,579 B2 * | 6/2004 | Spinazzola | H05K 7/20745 165/80.3 |
| 7,383,691 B2 * | 6/2008 | Felcman | H05K 7/20736 361/600 |

(Continued)

OTHER PUBLICATIONS

Definition of Plenum by Merriam-Webster, Sep. 18, 2016.*

(Continued)

*Primary Examiner* — Gregory Huson
*Assistant Examiner* — Dana Tighe
(74) *Attorney, Agent, or Firm* — McCarter & English, LLP

(57) ABSTRACT

Exemplary embodiments of a ventilating system for regulating a property of an electrical equipment cabinet are provided, generally including a duct configured and dimensioned to be mounted with respect to the electrical equipment cabinet. The exemplary ventilating system generally includes a damper mounted with respect to the duct and a sensor mounted with respect to at least one of the electrical equipment cabinet and the duct. The sensor is generally effective to generate signals related to the property. Exemplary methods for regulating a property of an electrical equipment cabinet with a ventilating system are provided, generally including throttling the damper based at least in part upon a sensed property to maintain a substantially zero pressure or temperature environment in the electrical equipment cabinet.

14 Claims, 8 Drawing Sheets

(58) Field of Classification Search
USPC .......... 454/154, 184; 361/691, 694; 700/278
See application file for complete search history.

(56) References Cited

U.S. PATENT DOCUMENTS

| | | | | |
|---|---|---|---|---|
| 7,643,291 | B2* | 1/2010 | Mallia | F24F 11/053 |
| | | | | 165/104.33 |
| 7,983,038 | B2 | 7/2011 | Levesque et al. | |
| 8,130,494 | B2 | 3/2012 | Larsen et al. | |
| 8,526,181 | B2 | 9/2013 | Levesque et al. | |
| 2005/0011208 | A1* | 1/2005 | Dobbs | F24F 11/053 |
| | | | | 62/178 |
| 2005/0170770 | A1* | 8/2005 | Johnson | H05K 7/20736 |
| | | | | 454/184 |
| 2009/0061756 | A1* | 3/2009 | Germagian | H05K 7/20836 |
| | | | | 454/184 |
| 2009/0129014 | A1 | 5/2009 | Larsen et al. | |
| 2010/0003911 | A1* | 1/2010 | Graczyk | H05K 7/20736 |
| | | | | 454/184 |
| 2010/0151781 | A1* | 6/2010 | Slessman | F28F 9/0265 |
| | | | | 454/184 |
| 2010/0252233 | A1* | 10/2010 | Absalom | H05K 7/20745 |
| | | | | 165/57 |
| 2011/0014061 | A1 | 1/2011 | Hopkins et al. | |
| 2012/0013229 | A1* | 1/2012 | Krietzman | H05K 7/20736 |
| | | | | 312/236 |
| 2014/0206273 | A1 | 7/2014 | Larsen et al. | |
| 2015/0118950 | A1 | 4/2015 | Larsen et al. | |

OTHER PUBLICATIONS

PCT International Search Report dated Dec. 9, 2013.
Liebert XDV™, User Manual—50 & 60 Hz—2008, Emerson Network Power, Columbus, OH, USA, available at http://www.emersonnetworkpower.com/en-US/Products/PrecisionCooling/HighDensityModularCooling/Documents/SL-16626.pdf, retrieved Jun. 9, 2014.
Fully utilize cooling infrastructure with Containment Cooling Systems. Opengate Data Systems (2012), available at http://www.opengatedata.com/Products/it-row-cooling.html, retrieved Jun. 9, 2014.
Exhaust Chimney Air Manager, Great Lakes Case & Cabinet (2013), Edinboro, PA, USA available at http://werackyourworld.com/products/accessories/cooling/exhaust-chimney-air-manager/, retrieved Jun. 9, 2014.
Energy Efficiency, Chatsworth Products, Inc. (2014), Westlake Village, CA, USA available at http://www.chatsworth.com/Solutions/By-Business-Need/Energy-Efficiency/, retrieved Jun. 9, 2014.
Eaton Heat Containment System, Eaton (2014), Raleigh, NC, USA available at http://powerquality.eaton.com/Products-services/Airflow-Management/Heat-Containment-System.asp, retrieved Jun. 9, 2014.
Products, Rittal GmbH & Co. KG (2014), Germany, available at http://www.rittal.com/com-en/content/en/produkte/produkte.jsp, retrieved Jun. 9, 2014.
Data Center Containment, Polargy, Inc. (2014), Sunnyville, CA, USA, available at http://www.polargy.com/products/polarplex/containment.php, retrieved Jun. 9, 2014.
Coolcentric Rear Door Heat Exchanger—Standard (RDHx), Coolcentric (2014), Pelham, NH, USA, available at http://www.coolcentric.com/products/rear-door-heat-exchangers.php, retrieved Jun. 9, 2014.
Thermal Containment, Hot Aisle Containment—IT Room Cooling Solutions, APC, West Kingston, RI, USA, available at http://www.apc.com/products/family/?id=275, retrieved May 29, 2015.
InRow Direct Expansion—Server Room & Data Center Cooling, APC, West Kingston, RI, USA, available at http://www.apc.com/products/family/?id=379, retrieved May 29, 2015.
PCT/US2013/049232, filed Jul. 3, 2013, WO 2014/011471 / Jan. 16, 2014.

* cited by examiner

VENTILATING SYSTEM FOR AN ELECTRICAL EQUIPMENT CABINET AND ASSOCIATED METHODS

CROSS-REFERENCE TO RELATED APPLICATIONS

The present application claims the benefit of provisional patent application entitled "Chimney for an Electrical Equipment Cabinet and Associated Methods" which was filed on Jul. 9, 2012, and assigned Ser. No. 61/669,217. The entire content of the foregoing provisional application is incorporated herein by reference.

TECHNICAL FIELD

The present disclosure relates to a ventilating system and, more particularly, to a ventilating system for regulating a property, such as a pressure or temperature, of an electrical equipment cabinet.

BACKGROUND

Cable management systems (such as electrical equipment cabinets, cable racks, bays or frames, which are hereinafter referred to as "cabinets") have long been used in a variety of applications, such as in communications and electronic services, and are generally located in indoor rooms, enclosures, offices or controlled environmental vaults. Cabinets generally include a variety of devices, e.g., patch panels, electrical equipment, and the like. Cabinets can further include a plurality of cables interconnecting the various devices mounted within or with respect to the cabinet.

In many instances, devices mounted within or with respect to a cabinet require a supply of cool air to ensure that a moderate operating temperature is maintained within the device. Cold air can be supplied to a cabinet by, e.g., a plurality of fans, a computer room air conditioning unit (CRAC), and the like, and can further be exhausted from the equipment by one or more equipment fans. Warm air can generally be exhausted through vents in the cabinet into, e.g., a space, a corridor, a return plenum, and the like.

With the advent of high-density electrical equipment that increasingly consume more amperage per device, such as switches and blade servers, the heat loads within the cabinet have generally risen from less than about 8 kW and now approach approximately 30 kW in some cabinets. Microchips are generally performing more calculations despite a shrinking footprint, thus consuming more power and further contributing to increased heat loads. In addition to the increased density of electrical equipment, virtualization continues to maximize hardware utilization, making the traditional hot aisle-cold aisle layout of IT equipment inadequate. Thus, IT managers are generally required to reduce their power usage effectiveness (PUE) while maintaining network integrity.

It is understood within the industry that maintaining separation of cold supply air and hot exhaust air allows supply air temperatures to be raised per American Society of Heating, Refrigerating and Air-Conditioning Engineers (ASHRAE) guidelines and improves cooling unit efficiency by returning air at higher temperatures to the cooling coils. Additionally, as is understood within the industry, an adequate and/or an oversupply of cold air generally does not, e.g., remediate hot spots, stop over temperature alarms, eliminate equipment failure due to high temperatures, and the like. Rather, fans within the equipment in the cabinet generally lose performance by, e.g., attempting to overcome a positive head pressure, being over-driven due to exposure to a negative plenum pressure, and the like. In particular, current chimney deployments are generally either passive or fan assisted. Passive chimneys generally allow direct access to a negative plenum pressure and allow the short cycling of the CRAC unit. Chimneys used in conjunction with fans generally, e.g., increase power consumption, contribute to short cycling of the CRAC unit, contribute to noise pollution within the data center, and result in other non-desirable effects.

Thus, a need exists for a ventilation system and associated methods for regulating a property, e.g., a pressure, a temperature, and the like, of an electrical equipment cabinet to eliminate (or substantially eliminate) warm exhaust air from devices mounted within or with respect to such cabinets in a more effective and/or reliable manner. These and other needs are addressed by the systems and methods of the present disclosure.

SUMMARY

In accordance with embodiments of the present disclosure, exemplary ventilating systems for regulating a property, e.g., a pressure, a temperature, and the like, of an electrical equipment cabinet are provided, generally including at least one duct configured and dimensioned to be mounted with respect to the electrical equipment cabinet. The exemplary ventilating systems generally include at least one damper mounted with respect to the at least one duct. The exemplary ventilating systems generally further include at least one sensor mounted with respect to at least one of the electrical equipment cabinet and the at least one duct. The at least one sensor can generally be effective to generate signals related to the property of the electrical equipment cabinet.

A mounting position of the duct with respect to the electrical equipment cabinet can be variably adjustable. In some exemplary embodiments, the ventilating systems include a duct extension mounted with respect to the duct. The duct can be configured and dimensioned to be mounted with respect to a return plenum. In some embodiments, the ventilating systems include a second sensor mounted outside of the electrical equipment cabinet and the duct. The second sensor can be effective to generate signals related to an outer property of the electrical equipment cabinet. The sensor and the second sensor may be at least one of, e.g., a temperature sensor, a pressure sensor, an airflow sensor, a transducer, and the like. The property and the outer property of the electrical equipment cabinet may be at least one of, e.g., a temperature, a pressure, an airflow, and the like.

The ventilating systems generally include an actuating mechanism configured and dimensioned to throttle the damper based at least in part upon the generated signals related to the property. In some embodiments, the ventilating systems include an actuating mechanism configured and dimensioned to throttle the damper based at least in part upon the generated signals related to the property and the outer property of the electrical equipment cabinet, e.g., a difference between the property and the outer property. The actuating mechanism can be, e.g., a pressure switch, a mechanical drive, a contractible wire, and the like. The damper can be, e.g., a variable damper, and the like. Throttling of the damper can generally be effective to maintain a substantially zero pressure or temperature environment in the electrical equipment cabinet.

In accordance with embodiments of the present disclosure, exemplary methods for regulating a property, e.g., a pressure, a temperature, and the like, of an electrical equipment cabinet with a ventilating system are provided, generally including mounting at least one duct with respect to the electrical equipment cabinet. The exemplary methods generally include mounting at least one damper with respect to the at least one duct. Further, the exemplary methods include mounting at least one sensor with respect to at least one of the electrical equipment cabinet and the at least one duct. The sensor can be effective to generate signals related to a property of the electrical equipment cabinet. The methods generally include sensing the property based on at least one signal generated by the sensor. The methods generally further include throttling the damper based at least in part upon the sensed property of the electrical equipment cabinet.

The exemplary methods generally include variably adjusting a mounting position of the duct with respect to the electrical equipment cabinet. In some exemplary embodiments, the methods include mounting a duct extension with respect to the duct. In some embodiments, the methods include generating signals related to an outer property of the electrical equipment cabinet with a second sensor mounted outside of the electrical equipment cabinet and the duct. The methods generally include throttling the damper based at least in part upon the signals generated by the sensor and the second sensor. The methods include throttling the damper with an actuating mechanism, e.g., a pressure switch, a mechanical drive, a contractible wire, and the like. In some embodiments, the methods include providing a voltage to the contractible wire to regulate a position of the damper by contracting and expanding the contractible wire. Throttling the damper can be effective to maintain a substantially zero pressure or temperature environment inside the electrical equipment cabinet. In some embodiments, the methods can include removing one or more side or divider panels of the electrical equipment cabinet to create a common return plenum to equalize temperature or pressure within the electrical equipment cabinet.

In accordance with embodiments of the present disclosure, exemplary ventilating systems are provided for an electrical equipment cabinet, generally including at least one duct configured and dimensioned to be mounted with respect to the electrical equipment cabinet. A mounting position of the at least one duct with respect to the electrical equipment cabinet can be variably adjustable.

In accordance with embodiments of the present disclosure, exemplary methods of assembly of a ventilating system for an electrical equipment cabinet are also provided, generally including mounting at least one duct with respect to the electrical equipment cabinet. The exemplary methods generally further include variably adjusting a mounting position of the at least one duct with respect to the electrical equipment cabinet.

Other objects and features will become apparent from the following detailed description considered in conjunction with the accompanying drawings. It is to be understood, however, that the drawings are designed as an illustration only and not as a definition of the limits of the invention.

BRIEF DESCRIPTION OF THE DRAWINGS

To assist those of skill in the art in making and using the disclosed devices and associated methods, reference is made to the accompanying figures, wherein.

DESCRIPTION OF EXEMPLARY EMBODIMENTS

In accordance with embodiments of the present disclosure, exemplary ventilating systems for regulating a property, e.g., a pressure, a temperature, and the like, of an electrical equipment cabinet are provided, generally including at least one duct configured and dimensioned to be mounted with respect to the electrical equipment cabinet. The exemplary ventilating systems generally include at least one damper mounted with respect to the at least one duct. The exemplary ventilating systems generally further include at least one sensor mounted with respect to at least one of the electrical equipment cabinet and the at least one duct. The at least one sensor can generally be effective to generate signals related to the property of the electrical equipment cabinet.

Figure 1:
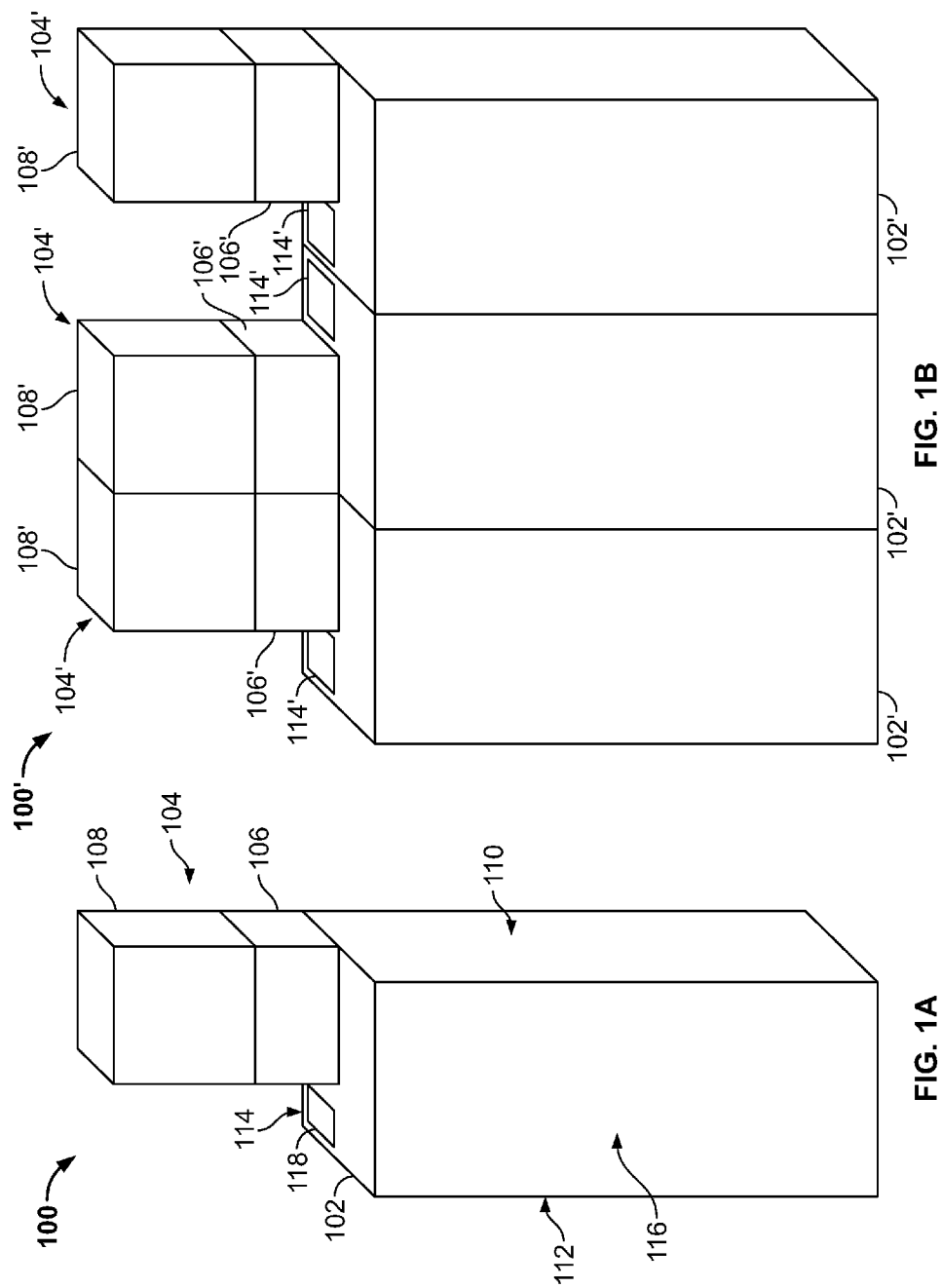
FIGS. 1A and B show exemplary embodiments of stand-alone and bayed cabinets with exemplary ventilating systems.

Turning now to FIGS. 1A and 1B, exemplary embodiments of stand-alone and bayed cabinets with exemplary ventilating systems according to the present disclosure are provided, i.e., cabinet and chimney assemblies 100 and 100', respectively. In particular, FIG. 1A schematically depicts a stand-alone cabinet 102 and a chimney assembly 104. The chimney assembly 104 generally includes a chimney base 106, i.e., at least one duct configured and dimensioned to be mounted with respect to the cabinet 102. In some exemplary embodiments, the chimney assembly 104 can include a chimney extension 108 for extending the height of the chimney assembly 104. Although illustrated with one chimney extension 108, in other exemplary embodiments, the chimney assembly 104 can include, e.g., one, two, three, four, five, and the like, chimney extensions 108.

The exemplary chimney assembly 104 can be mounted to or with respect to the cabinet 102 by, e.g., attaching chimney flanges (not shown) to the cabinet 102, and the like. The mounting position of the chimney assembly 104 can be mounted with respect to the cabinet 102 in a variable adjustable manner, e.g., an off-set manner, and the like. For example, although illustrated as aligned with a right side 110 and a rear side 114 of the cabinet 102, in other exemplary embodiments, the mounting position of the chimney assembly 104 can be aligned with at least one of, e.g., a right side 110, a left side 112, a rear side 114, a front side 116, and the like, of the cabinet 102. In some embodiments, the chimney assembly 104 can be centered with respect to the top surface of the cabinet 102. The adjustable positioning and/or justification of the chimney assembly 104 relative to the cabinet 102 allows the creation of an entry/egress 118 opening. Unlike the solid structure of chimneys utilized in the industry, the adjustable positioning functionality of the exemplary chimney assembly 104 allows the entry/egress 118 to be utilized for mounting of, e.g., a cable tray, a fiber duct, fire suppression, lighting, a bus duct, cable management, lighting, heating ventilation and air conditioning (HVAC) ducts, electrical distribution ducts, and the like, perpendicular to the cabinet 102 and/or within aisles of the cabinet 102. For example, the entry/egress 118 may be implemented to pass a plurality of cables to and from electrical equipment located in the cabinet 102.

With reference to FIG. 1B, a cabinet and chimney assembly 100' is provided for bayed cabinets 102'. The cabinet and chimney assembly 100' of FIG. 1B is substantially similar in structure and/or function to that of FIG. 1A. In particular, the cabinet and chimney assembly 100' generally includes cabinets 102' and chimney assemblies 104'. The chimney assemblies 104' include chimney bases 106' and may optionally include chimney extensions 108'. Based on the mounting position of the chimney assembly 104' with respect to a cabinet 102', an entry/egress 114' can be created and implemented for passage of, e.g., cables, and the like. As discussed above with respect to FIG. 1A, the chimney assembly 104' may be justified and/or positioned at various mounting positions on a cabinet 102', thereby permitting a variable positioning and/or creation of the entry/egress 114'. Although illustrated with three bayed cabinets 102', in other exemplary embodiments, the cabinet and chimney assembly 100' can include, e.g., two, three, four, five, six, seven, and the like, cabinets 102' positioned and/or linked relative to each other.

Figure 2:
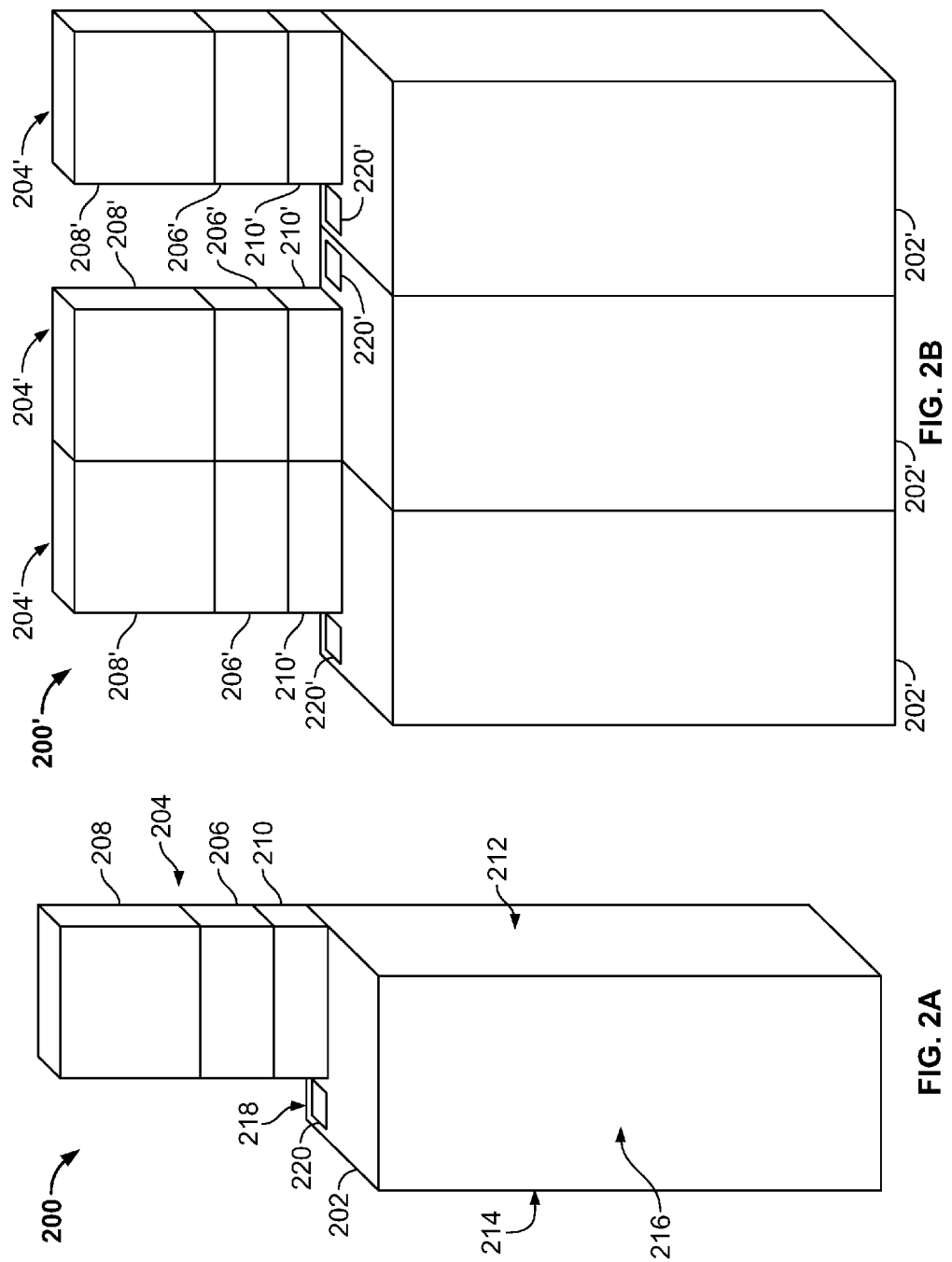
FIGS. 2A and B show exemplary embodiments of stand-alone and bayed cabinets with exemplary ventilating systems including a damper.

Turning now to FIGS. 2A and 2B, exemplary embodiments of stand-alone and bayed cabinets with exemplary ventilating systems are provided, i.e., cabinet and chimney assemblies 200 and 200'. FIG. 2A illustrates a stand-alone cabinet and chimney assembly 200 which generally includes a cabinet 202 and a chimney assembly 204 substantially similar in structure and/or function to those of FIGS. 1A and 1B. In particular, the exemplary chimney assembly 204 includes a chimney base 206 and, optionally, a chimney extension 208. In some exemplary embodiments, the chimney assembly 204 can include at least one damper 210, e.g., a variable damper, and the like. The mounting position of the chimney assembly 204 with respect to the front side 216, right side 212, left side 214, and/or rear side 218 of the cabinet 202 can be such that an entry/egress 220 may be created for, e.g., passage of a plurality of cables to and from the electrical equipment located inside the cabinet 202.

At least one sensor (not shown) can be mounted, e.g., within the cabinet 202, within the chimney base 206, within the chimney extension 208, outside of the cabinet 202, outside of the chimney base 206, outside of the chimney extension 208, and the like. The sensor can be, e.g., a temperature sensor, a pressure sensor, an airflow sensor, and the like. The sensor can be effective to generate at least one signal related to at least one cabinet property, e.g., a temperature, a pressure, an airflow, and the like. In some embodiments, at least one pressure switch, drive mechanism and/or contractible wire (not shown) can be mounted within, e.g., the cabinet 202, the chimney base 206, the chimney extension 208, the damper 210, and the like, for throttling the damper 210 based at least in part upon the generated signals related to the at least one cabinet property. For example, based on a temperature signal generated by the sensor, the pressure switch can throttle, i.e., regulate, adjust, and the like, the opening and/or closing of the damper 210 such that a predetermined cabinet 202 environment can be maintained. The predetermined cabinet 202 environment can be, e.g., a cabinet 202 pressure, a cabinet 202 temperature, a cabinet 202 airflow, and the like.

In some embodiments, the at least one pressure switch, drive mechanism and/or contractible wire can throttle the damper 210 based at least in part upon the generated signals related to the property measured within the cabinet 202 and the property measured outside of the cabinet 202, e.g., a difference between the property within and outside of the cabinet 202. For example, based on a difference between a temperature signal generated by the sensor inside of the cabinet 202 and outside of the cabinet 202, the damper 210 can be throttled to open and/or close the damper 210 such that a predetermined cabinet 202 environment can be maintained.

With reference to FIG. 2B, the stand-alone cabinet and chimney assembly 200 may be combined into a bayed cabinet and chimney assembly 200'. In particular, the cabinet and chimney assembly 200' generally includes a plurality of cabinets 202' and a plurality of chimney assemblies 204'. Each chimney assembly 204' generally includes a chimney base 206' and, optionally, a chimney extension 208'. In some exemplary embodiments, the chimney assembly 204' also includes a damper 210', e.g., a variable damper, and the like. As discussed with respect to FIG. 2A, the mounting position of the chimney assembly 204' with respect to the cabinet 202' generally permits the creation of an entry/egress 220' for, e.g., passing a plurality of cables to and from the electrical equipment located inside the cabinet 202'. Although illustrated with three cabinets 202', in other exemplary embodiments, the cabinet and chimney assembly 200' can include, e.g., two, three, four, five, six, seven, and the like, cabinets 220' interconnected and/or positioned relative to each other.

Figure 3:
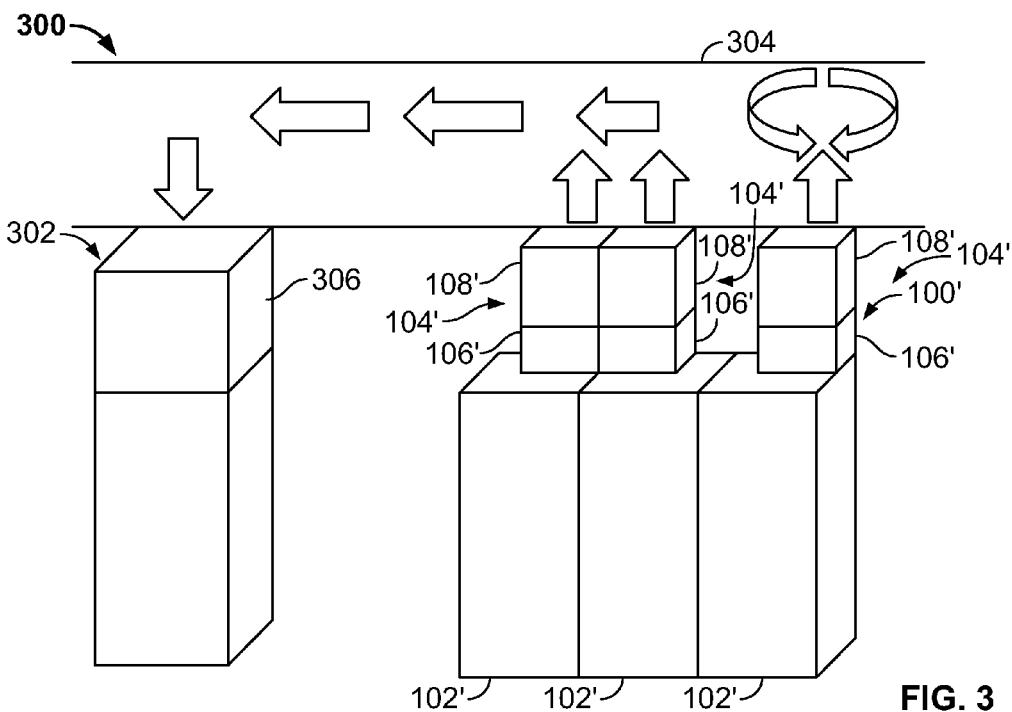
FIG. 3 shows a short cycle of an exemplary embodiment of bayed cabinets and a cooling unit with exemplary ventilating systems.

Turning now to FIG. 3, a short cycle of an exemplary embodiment of a cooling unit with an exemplary cabinet and chimney assembly is provided. In particular, the assembly 300 of FIG. 3 generally includes a cooling unit 302, e.g., a CRAC unit, and the like, a cabinet and chimney assembly 100', and a return plenum 304. Although illustrated with three cabinets 102' and chimney assemblies 104', in other exemplary embodiments, the assembly 300 can include, e.g., one, two, three, four, five, six, seven, and the like, cabinets 102' and chimney assemblies 104'. The chimney assembly 104' generally terminates to the return plenum 304, thereby delivering the exhausted warm air from the cabinet 102' to the return plenum 304. The cooling unit 302 generally includes a collar 306 which terminates to the return plenum 304, thereby receiving the exhausted warm air to be cooled and released into the space housing the assembly 300.

As can be seen from the arrows illustrating the airflow of the exhausted warm air, the chimney assemblies 104' closest to the cooling unit 302 generally create a passive short cycle of recirculated air. In particular, the air being exhausted from the chimney assemblies 104' closest to the cooling unit 302 cycles through the return plenum 304 and into the cooling unit 302. In contrast, the chimney assembly 104' farthest from the cooling unit 302 generally creates a stagnant and/or recirculating area of air flow in the return plenum 304 which fails to pass to the cooling unit 302. In particular, the air exhausted from the chimney assembly 104' farthest from the cooling unit 302 remains in the area of the return plenum 304 above the farthest chimney assembly 104' and fails to travel along the return plenum 304 to the cooling unit 302. Thus, the distribution of airflow through the return plenum 304 is generally not equal due to the positioning of the chimney assemblies 104' relative to the cooling unit 302.

Figure 4:
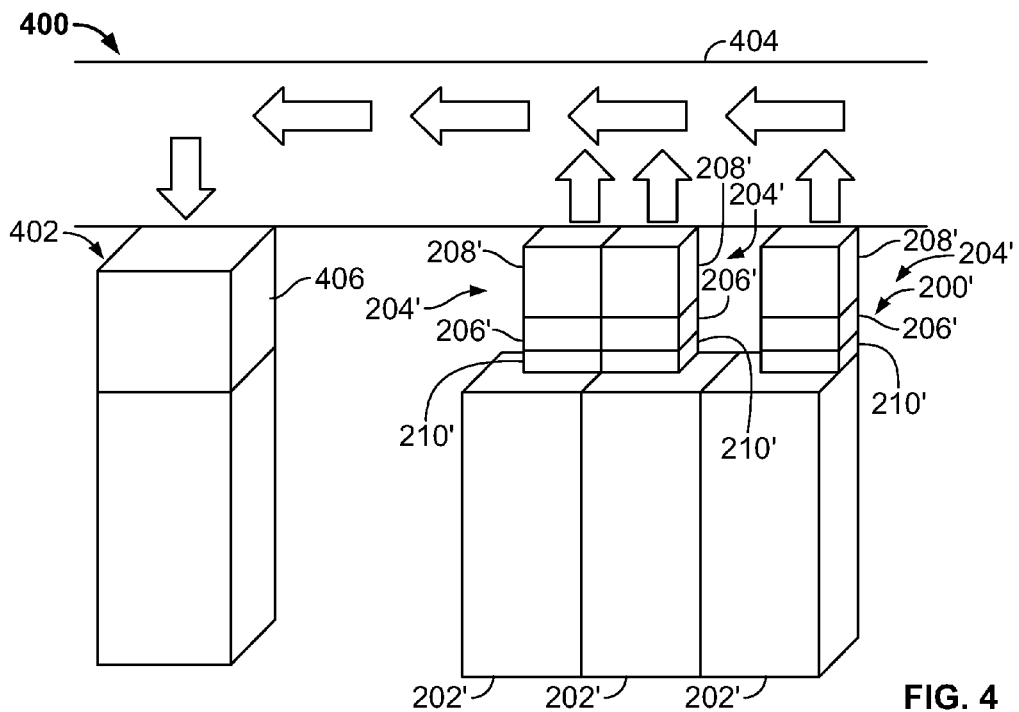
FIG. 4 shows an exemplary embodiment of bayed cabinets and a cooling unit with exemplary ventilating systems including a damper.

With reference to FIG. 4, an exemplary embodiment of a cooling unit with an exemplary cabinet and chimney assembly is provided. In particular, the assembly 400 of FIG. 4 generally includes a cooling unit 402, e.g., a CRAC unit, and the like, a cabinet and chimney assembly 200', and a return plenum 404. Although illustrated with three cabinets 202' and chimney assemblies 204', in other exemplary embodiments, the assembly 400 can include, e.g., one, two, three, four, five, six, seven, and the like, cabinets 202' and chimney assemblies 204'. The chimney assembly 204' generally terminates to the return plenum 404, thereby delivering the exhausted warm air form the cabinet 202' to the return plenum 404. The cooling unit 402 generally includes a collar 406 which terminates to the return plenum 404, thereby receiving the exhausted warm air to be cooled and released into the space housing the assembly 400.

As can be seen from the arrows illustrating the airflow of the exhausted warm air, the dampers 210' in the chimney assemblies 204' generally control and/or maintain the environment in the cabinets 202', e.g., the pressure, temperature, airflow, and the like, such that substantially equal distribution of negative plenum pressure exists across the row of cabinets 202'. In particular, the equal distribution of negative plenum pressure creates an evenly distributed flow of air through the return plenum 404 and into the cooling unit 402.

Although the discussion below is with respect to the exemplary cabinet and chimney assembly 200 of FIG. 2A, those of ordinary skill in the art should understand that the present discussion may apply to all of the exemplary chimney assemblies discussed herein. The exemplary chimney assembly 204 opening area can be, e.g., approximately 16 $in^2$, 18 $in^2$, 20 $in^2$, 22 $in^2$, 24 $in^2$, and the like. The chimney assembly 204 can be placed and/or attached on top of a cabinet 202. Further, the chimney assembly 204 can be justified with, e.g., the right side 212, the left side 214, the front side 216, and/or the rear side 218 of the cabinet 202, with the remaining area to be utilized for cable and/or power entry/egress through the entry/egress 220. For example, the exemplary chimney assembly 204 may be justified on the left side 214 or the right side of the cabinet 202. In some embodiments, the chimney assembly 204 can be centered relative to the top surface of the cabinet 202.

Although illustrated with the damper 210 mounted to the cabinet 202, in other exemplary embodiments, the order of mounting the damper 210, the chimney base 206, and/or the chimney extension 208 relative to the cabinet 202 may be interchanged. Thus, for example, the chimney base 206 can be mounted to the cabinet 202 and the damper 210 can further be mounted to the chimney base 206. One or more chimney extensions 208 may further be implemented to extend the height of the chimney assembly 204 to a desired height, e.g., a height necessary to reach a return plenum.

Each chimney assembly 204 can generally be utilized passively and/or in conjunction with a damper 210, e.g., a variable damper, which can be cycled or throttled with an actuating mechanism, such as a pressure switch, a drive mechanism and/or a contractible wire (not shown). The actuating mechanism generally allows the cabinet 102 to maintain a substantially zero pressure and/or temperature environment in the rear of the cabinet 202. For example, when the chimney assembly 204 is terminated to a return plenum 404, the actuating mechanism can be actuated, e.g., automatically, manually, and the like, to throttle the damper 210. Throttling of the damper 210 generally optimizes the performance of the axial fans located within the IT equipment. In particular, the fans within the IT equipment located in the cabinet 102 generally will not lose performance by, e.g., attempting to overcome a positive head pressure, and the like, and will not be overdriven due to, e.g., exposure to a negative plenum pressure, and the like. Utilizing the chimney assembly 204 and at least one damper 210 in a complete row generally ensures that the exposure of the cabinet 202 to the negative plenum can be substantially distributed throughout the row of cabinets 202.

In some embodiments, utilizing the chimney assembly 204 and the damper 210 in a complete row can ensure that the exposure of the cabinet 202 to the negative plenum can be correctly balanced based on the cabinet 202 loads and the location of the cabinet 202 relative to the cooling unit 402. This balancing can regulate airflow through each cabinet 202 to correctly compensate for the varying return plenum 404 pressures driven by the location of the cabinet 202 to the cooling unit 402. As discussed above, the return plenum 404 can include higher negative pressure closer to the cooling unit 402, which can lead to short cycling.

The substantially distributed negative plenum pressure in the row of cabinets 202 generally replaces a high negative plenum pressure above the cabinet 202 closest to the cooling unit 402 and/or replaces a positive plenum pressure above the cabinet 202 that is the furthest away from the cooling unit 402. Regulating the airflow through the cabinet 202 generally allows the heat from the exhausted air to transfer from the equipment, e.g., IT equipment, and the like, to the cold air and/or return to the cooling unit 402. This transfer of exhausted warm air generally allows the equipment located inside the cabinet 202 to perform approximately at the manufacturer's recommended specifications, thereby optimizing the efficiency of the cooling unit 402, e.g., a variable speed CRAC unit, and the like.

The exemplary chimney assembly 204 can be implemented in conjunction with, e.g., a bottom panel, a top panel, a gasketed rear door, blanking panels, an air dam kit, and the like. In some exemplary embodiments, an angular device (not shown) can be mounted on the bottom rear of the cabinet 202 to facilitate airflow. The cable entry/egress 220 opening can generally be sealed with, e.g., a brush strip, a non-permeable material, and the like, to prevent bypass airflow and/or particulate contamination within the cabinet 202. As discussed above, the controls for the damper 210 can be, e.g., a power cord, a control board containing at least one sensor, a pressure switch, a mechanical drive mechanism, a contractible wire, and the like. For example, in some exemplary embodiments, one sensor can be positioned inside the cabinet 202. In other exemplary embodiments, one sensor can be positioned inside the cabinet 202 and another sensor can be positioned inside the chimney assembly 204 in order to generate signals and/or calculate a differential in signals to control the damper 201, e.g., a temperature differential, a pressure differential, an airflow differential, and the like. In some embodiments, one sensor can be positioned inside the cabinet 202 and another sensor can be positioned outside of the cabinet 202 in order to generate signals and/or calculate a differential in signals to control the damper 201.

As a further example, the damper 210 generally opens and/or closes based on the input of a sensor located in the rear of the cabinet 202 with the goal of maintaining and/or creating a substantially zero pressure and/or temperature atmosphere in the cabinet 202, e.g., in the rear of the cabinet 202, and the like. In some embodiments, the zero pressure and/or temperature atmosphere can be the pressure and/or temperature specified by a manufacturer for the equipment. Thus, the variable damper 210 regulation generally allows the equipment fans to function approximately per a manufacturer's specification and/or not to be overdriven by a negative plenum pressure. In addition, the equipment fans generally do not suffer from a reduced performance while trying to overcome a positive pressure due to the location of the cabinet 202 in reference to the cooling unit 402. Segregating the hot air from the cold air streams within the data canter, i.e., cabinet 202, generally increases efficiency, predictability and/or repeatability of deployed equipment. The exemplary chimney assembly 204 can generally be implemented in a variety of environments, including when the infrastructure contains a slab floor, where a cold aisle containment is generally not feasible and a hot aisle containment is generally rebuffed due to undesirable human conditions, i.e., working within an approximately 100° F. hot aisle.

In accordance with exemplary embodiments of the present disclosure, when utilized with air dam kits and/or blanking panels, the exemplary chimney assembly 204 equipped with a sensor-based damper 210 generally forces substantially all of the cold air to pass through the equipment at a substantially regulated flow. The regulated flow of cold air generally remediates and/or reduces, e.g., hot spots, over temperature alarms, the data center's PUE, and the like. In cabinets 202 with low pressure, i.e., a low airflow in cubic feet per minute, the damper 210 can remain in a substantially closed position, thereby not allowing air to migrate down the chimney assembly 204 and into the cabinet 202 in positive plenum pressure environments. In some embodiments, in cabinets 202 with low pressure, the damper 210 can variably throttle to a position that will not allow air to migrate down the chimney assembly 204. The exemplary chimney assembly 202 can also be used in, e.g., a stratification deployment, a passive fashion, and the like.

In some exemplary embodiments, the command and/or control of the cycling of the damper 210 can be based on the sensed cabinet property, e.g., a temperature, a pressure, and the like, in the rear of the cabinet 202. In such exemplary embodiments, an input signal would generally be derived from at least one sensor, e.g., a temperature sensor, and the like. For example, the damper 210 can be cycled from the temperature differential, i.e., a $\Delta T$, from the intake temperature and the exhaust temperature based on sensor readings from within the cabinet 202 and the chimney assembly 204. In some embodiments, the temperature differential can be determined based on a temperature inside of the cabinet 202 and outside of the cabinet 202. When the temperature differential reaches a preset and/or predetermined value, such as a maximum temperature, the damper 210 can be opened until the temperature differential falls below a baseline setting. Similarly, if a temperature differential reaches a present and/or predetermined value, such as a minimum temperature, the damper 210 can be closed or regulated into a partially open position until the temperature differential increases to a baseline setting. As would be understood by those of ordinary skill in the art, once the temperature differential has reached the baseline setting, the damper 210 can be regulated to, e.g., close, remain partially open, fully open, and the like, such that the temperature inside of the cabinet 202 remains at the desired value.

In some exemplary embodiments, the damper 210 can be cycled and/or regulated based on a pressure differential, i.e., a $\Delta P$. For example, a primary pressure sensor can reside, e.g., outside of the cabinet 202, inside the chimney assembly 204 above the damper 210 location, in the return plenum 404, and the like. A secondary pressure sensor can reside in the rear of the cabinet 202. Thus, when a pressure differential reaches a preset and/or predetermined value, such as a maximum pressure, the damper 210 can be opened until the pressure falls below or to the baseline setting. Similarly, when a pressure differential reaches a preset and/or predetermined value, such as a minimum pressure, the damper 210 can be closed or partially opened until the pressure increases to the baseline setting. Once the pressure differential has reached the baseline setting, the damper 210 can be regulated to, e.g., close, remain partially open to a desired degree, fully open, and the like, such that the pressure inside of the cabinet 202 remains at the desired value.

In some exemplary embodiments, the damper 210 can be cycled and/or regulated based on an airflow differential, i.e., a $\Delta AF$, based on at least one airflow sensor. For example, the damper 210 can be regulated and/or cycled based on a predetermined algorithm using the cubic feet per minute as the input signal from one airflow sensor. The damper 210 can also be regulated and/or cycled based on the airflow differential calculated from signals generated by at least two airflow sensors placed above and below the damper 210. This type of application generally balances the plenum with the rear of the cabinet 202. Thus, if the airflow differential is above a preset and/or predetermined value, such as a maximum airflow, the damper 210 can be closed or partially opened until the airflow differential reaches a baseline setting. Similarly, if the airflow differential below a preset and/or predetermined value, such as a minimum airflow, the damper 210 can be opened or the angle of the partially opened damper 210 can be increased until the airflow differential reaches a baseline setting. Once the airflow differential has reached the baseline setting, the damper 210 can be regulated to, e.g., close, remain partially open to a desired degree, fully open, and the like, such that the airflow inside the cabinet 202 remains at the desired value.

In some exemplary embodiments, the damper 210 can be cycled and/or regulated based on an input signal from the power distribution unit (PDU). In general, the ratio between power consumption and heat load generation is approximately 1 to 1. Thus, for approximately one kW of power consumed, approximately one kW of heat is generated. The amount of power being consumed within the cabinet 202 at any given time can generally be used as the variable input from the PDU to control and/or cycle the damper 210.

In some exemplary embodiments, damper 210 can be configured to accept an auxiliary input command signal from, e.g., a fire suppression system. Thus, the damper 210 could be regulated and/or cycled to open and/or close in response to a pre-charge in the fire suppression system or when the fire suppression system is activated.

In some exemplary embodiments, the control of the damper 210 can be, e.g., IP based, and the like, and connected to a network using any sensor input discussed herein, e.g., temperature, pressure, airflow, and the like. In general, the damper 210 system can be deployed on bayed and/or ganged cabinets 202 with and/or without divider panels. Further, the exemplary chimney assembly 204 and/or cabinet 202 can generally contain a "kill" switch to remove the power source from the damper 210. However, the damper 210 can be automatically or manually actuated into an open and/or closed position when the power source has been removed, thus permitting, e.g., maintenance, testing, and the like.

Although discussed herein as separate temperature differentials, pressure differentials, airflow differentials, PDUs, auxiliary input command signals, and the like, in some embodiments, regulation of the damper 210 can be based on one or more of the sensed properties or input signals. For example, regulation of the damper 210 can be based on the pressure and temperature differentials within and outside of the cabinet 202.

In some exemplary embodiments, the control for the damper 210 can be, e.g., motor driven, mechanically actuated, and the like. For example, a motor can receive an auxiliary input command signal to regulate the position of the damper 210. In some exemplary embodiments, the damper 210 can be a weighted damper 210 which allows flow of air in one direction only and prevents the return of air through the damper 210 in an opposite direction. For example, the weighted damper 210 can allow air to flow out of the cabinet 202 and into the return plenum, while preventing air to flow from the return plenum back into the cabinet 202.

In some exemplary embodiments, the damper 210 can be controlled by a wire which contracts or shrinks when the wire is electrically driven, e.g., a FLEXINOL® wire which contracts by approximately 4% of the wire length when a voltage is applied. The wire can be anchored on one end to a fixed position, e.g., an inner wall of the cabinet 202, and can terminate at a spring on the opposing end. The spring can be connected to the wire on one end and connected to a mechanical linkage fastened to the damper 210 on the opposing end. As a sensor measures a cabinet 202 property, e.g., a pressure sensor measures a varying pressure, a temperature sensor measures a varying temperature, an airflow sensor measures a varying airflow, and the like, the supply of voltage to the wire can be adjusted. For example, a microprocessor receiving the signals generated by the sensor can, in turn, output a signal to an actuating mechanism such that the supply of voltage to the wire can be adjusted. The variation in voltage supplied to the wire can cause the wire to lengthen or shrink depending on the current state of the wire. As the wire expands and contracts, the wire can exert or release a force on the spring which, in turn, can open and close the damper 210. The position of the damper 210 can thereby be regulated to adjust the pressure, temperature and/or airflow in the cabinet 202.

Figure 5:
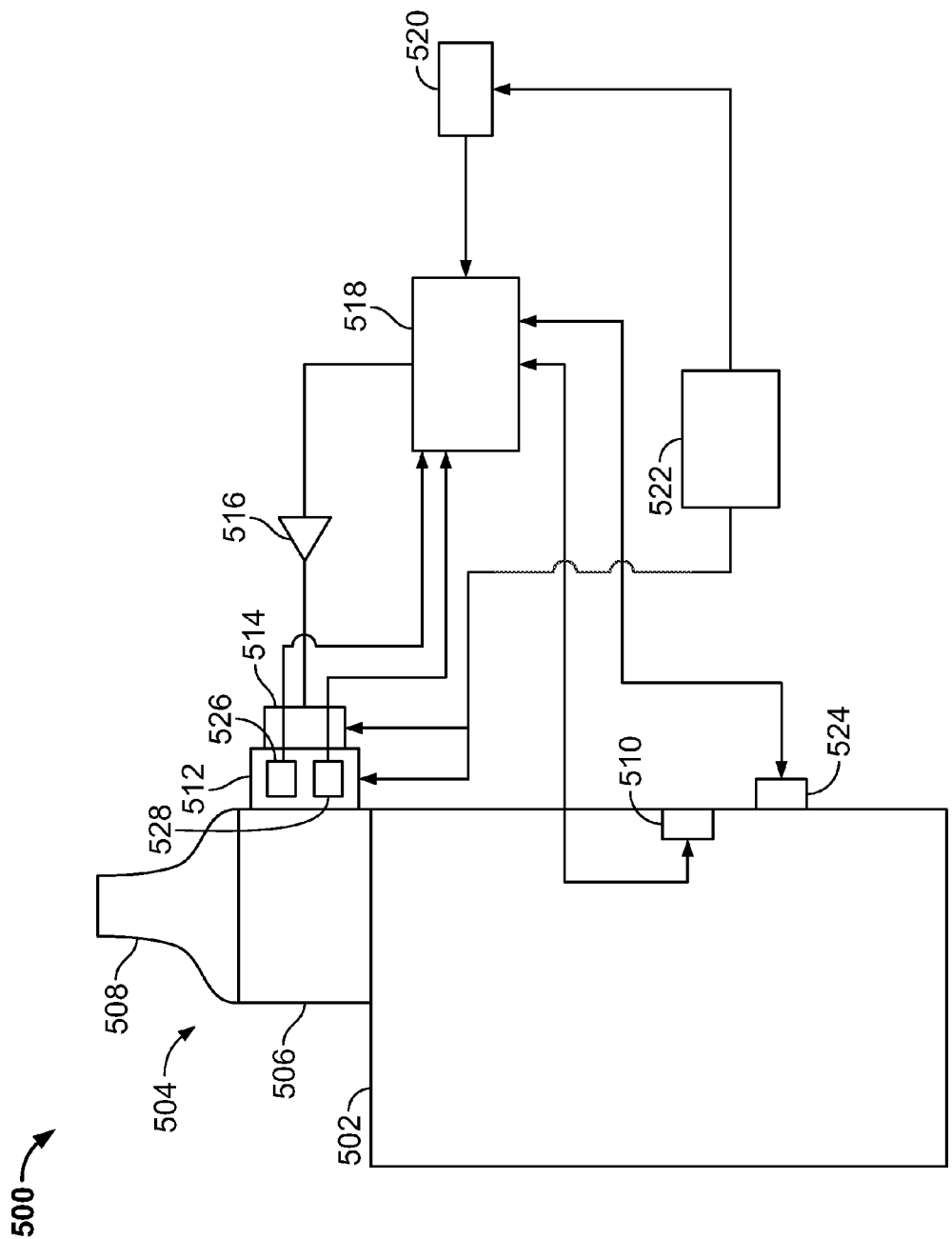
FIG. 5 shows a block diagram of an exemplary embodiment of a control system for a cabinet with an exemplary ventilating system including a damper.

Turning now to FIG. 5, a block diagram of an exemplary control system 500 for a cabinet 502 and a chimney assembly 504 is provided. In particular, the chimney assembly 504 includes a damper 506 and a chimney 508, and the control system 500 can be implemented to regulate the position of the damper 506, e.g., fully open, partially open to a desired degree, and fully closed. The cabinet 502 generally includes at least one sensor 510, e.g., a barometric pressure sensor, a temperature sensor, an airflow sensor, and the like. Although illustrated as positioned within the cabinet 502, in some embodiments, the sensor 510 can be positioned within the damper 506 portion of the chimney assembly 504 and/or within the chimney 508. The system 500 generally includes a modulatable damper control actuator 512, a digital converter amplifier 514 (DC amplifier 514), and a digital-to-analog converter 516 (DAC 516). In embodiments implementing a wire which contracts when voltage is applied to the wire, e.g., a FLEXINOL® wire, rather than using a DAC 516, a built in pulse width modulation (PWM) capability of a microcontroller board can be used to modulate the FLEXINOL® wire current using a power transistor, thereby controlling the opening and closing of the damper 506. For example, an Arduino® Nano microcontroller board with a built in PWM capability can be used to modulate the current being supplied to the contractible wire.

The system 500 includes a microprocessor 518 (MP 518), e.g., a processing device, a voltage regulator 520 and a power supply 522, e.g., a 24 VDC power supply. In some embodiments, the damper control actuator 512 can be modulated between approximately 0 VDC to approximately 10 VDC. Power can be supplied to the damper control actuator 512, the internal components of the damper control actuator 512, and the DC amplifier 514 via a serial link connected to the power supply 522. The power supply 522 can be further electrically connected to the voltage regulator 520 which, in turn, can provide a regulated voltage to the microprocessor 518. The microprocessor 518 can also receive a signal from the sensor 510 indicating a measured pressure, temperature and/or airflow within the cabinet 502 for regulating opening and closing of the damper 506. Based on the received signal from the sensor 510, the microprocessor 518 can send a signal through the DAC 516 to the DC amplifier 514. In some embodiments, in addition to the signal received from the sensor 510, the microprocessor 518 can receive a signal from a sensor 524, e.g., an ambient sensor, which measures a pressure and/or temperature outside of the cabinet 502. In embodiments including signals received from the sensor 510 within the cabinet 502 and the sensor 524 outside of the cabinet 502, a pressure and/or temperature differential signal can be generated and sent by the microprocessor 518 through the DAC 516 to the DC amplifier 514 to regulate opening and closing of the damper 506. The DC amplifier 514 can, in turn, provide the necessary voltage to the damper control actuator 512, e.g., a motor controller, which can regulate the position of the damper 506 within the chimney assembly 504. In some embodiments, the damper control actuator 512 can include limit switches, e.g., a fully open limit switch 526 and a fully closed limit switch 528, therein which can send signals to the microprocessor 518 to indicate a position of the damper 506.

For example, if the signal received from the sensor 510 by the microprocessor 518 indicates that the temperature within the cabinet 502 is increasing, the microprocessor 518 can send the appropriate control signal to the damper control actuator 512 to actuate the damper 506 into a more open position. Similarly, if the signal received from the sensor 510 by the microprocessor 518 indicates that the temperature within the cabinet 502 is decreasing, the microprocessor 518 can send the appropriate control signal to the damper control actuator 512 to actuate the damper 506 into a more closed position to regulate the temperature within the cabinet 502. As a further example, if the signals received from the sensors 510, 524 by the microprocessor 518 indicate that the temperature differential is increasing, the microprocessor 518 can send the appropriate control signal to the damper control actuator 512 to actuate the damper 506 into a more open position. Similarly, if the signals received from the sensors 510, 524 by the microprocessor 518 indicate that the temperature differential is decreasing, the microprocessor 518 can send the appropriate control signal to the damper control actuator 512 to actuate the damper 506 into a more closed position to regulate the temperature within the cabinet 502.

Figure 6:
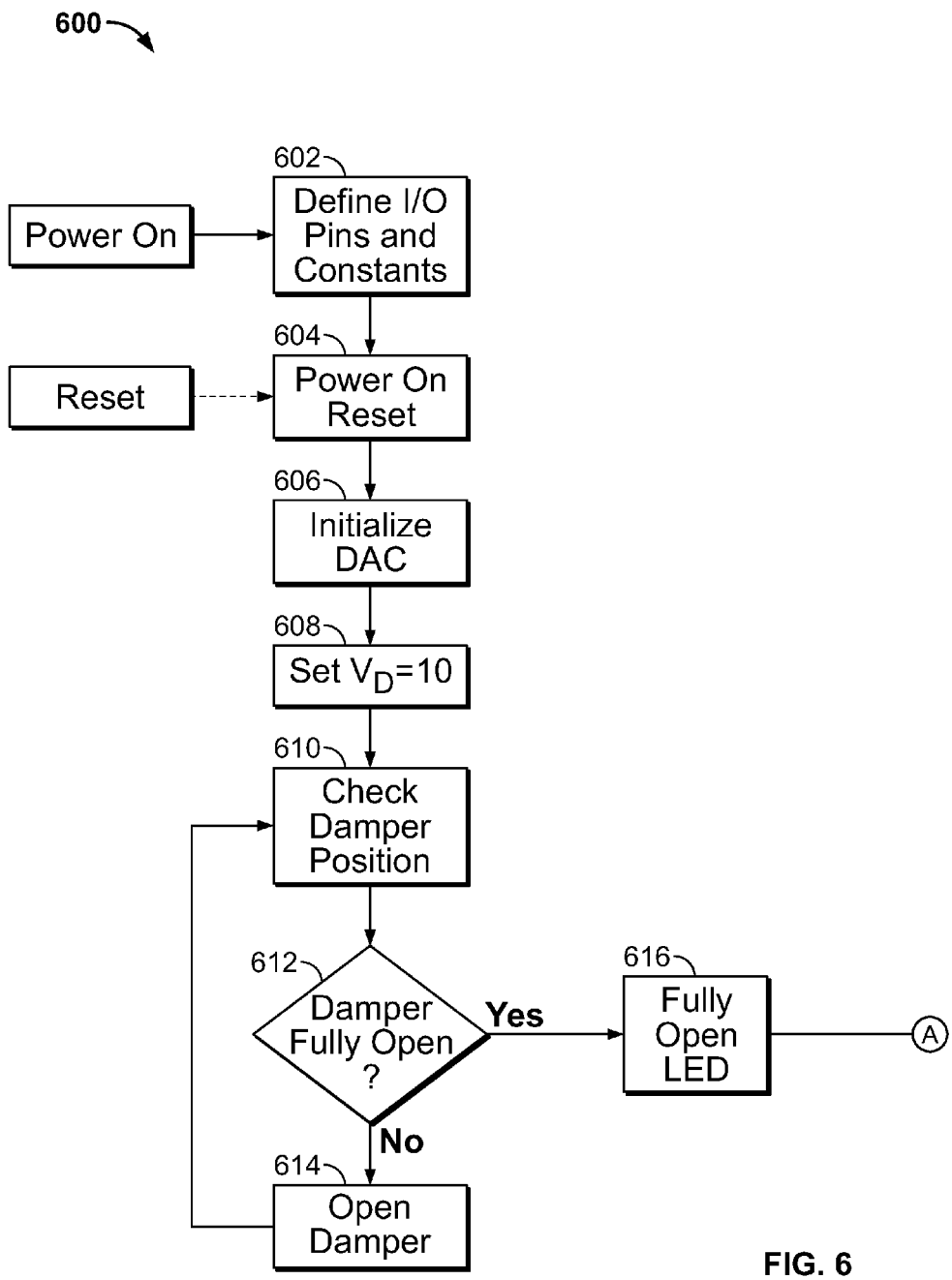
FIG. 6 shows a flow chart of an exemplary embodiment of a control system for a cabinet with an exemplary ventilating system including a damper.
Figure 6:
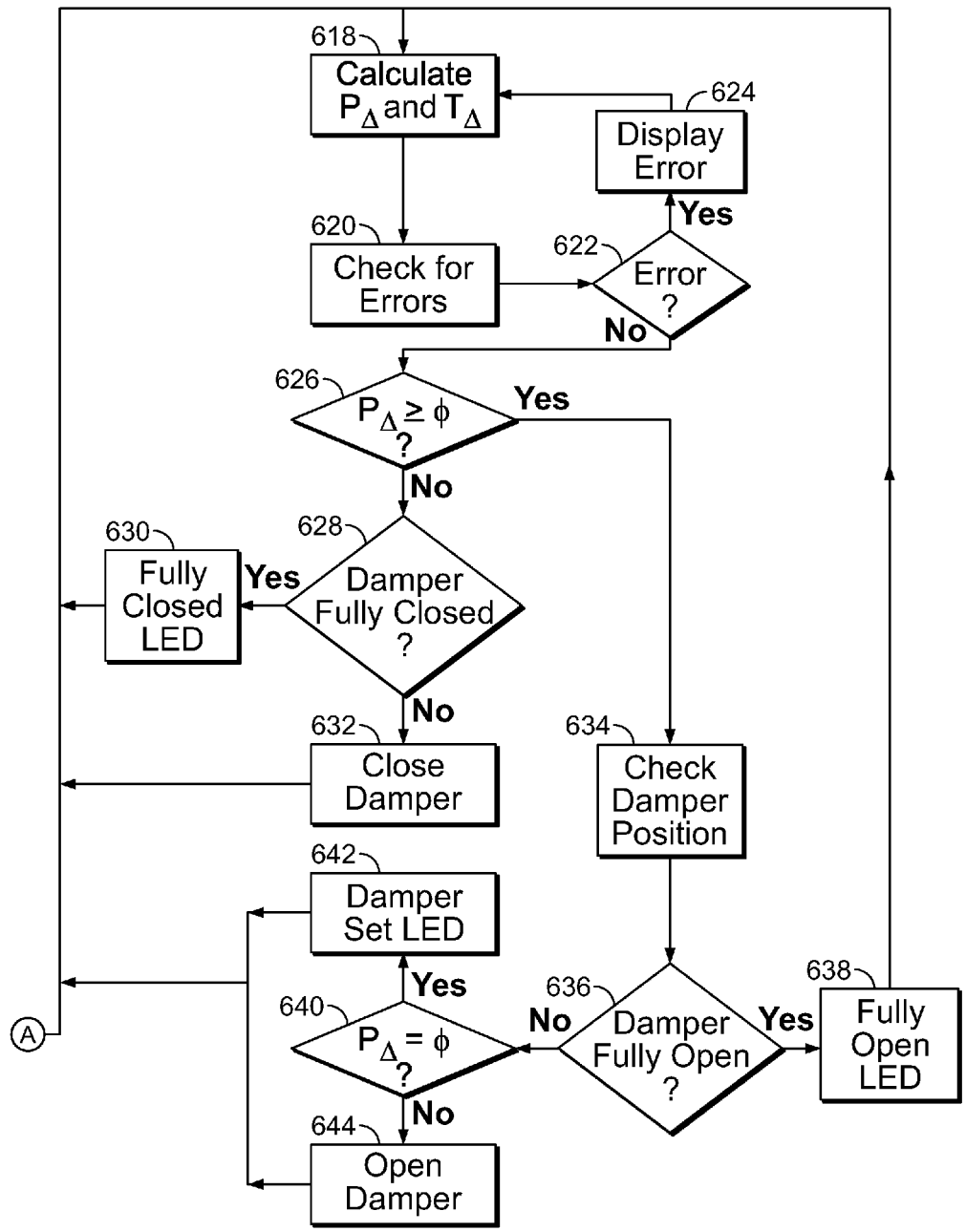

With reference to FIG. 6, a flow chart of an exemplary control system 600 for a cabinet 502 with a chimney assembly 504 including a damper 502 is provided. In some embodiments, the control system 600 can be used for regulating a position of the damper 502 with a motor controller. In some embodiments, the control system 600 can be used for regulating a position of the damper 502 with a contractible wire, e.g., a FLEXINOL® wire. The system 600 can be powered on, which defines the input/output (I/O) pins and constants of the system 600 (602). For example, powering on the system 600 can run software which defines the analog and digital I/O pins of the microprocessor 518, allows communication setup between the sensors 510, 524 and the microprocessor 518, and/or allows communication setup between the PWM and the microprocessor 518. In some embodiments, powering on the system 600 can set up the fully open and fully closed limit switches 526, 528 to indicate the position of the damper 506 to the microprocessor 518 and sets up the I/O pins to allow the microprocessor 518 to receive signals from the fully open and fully closed limit switches 526, 528. Powering on the system 600 can further define the constants, such as a predetermined property (e.g., a predetermine pressure, a predetermined temperature, a predetermined airflow, and the like) for the system 600.

In some embodiments, rather than powering on, the system 600 can be reset via a reset button (604). It should be understood that resetting the system 600 powers the system 600 and also defines the I/O pins and constants of the system 600. Once the system 600 has been powered on, the DAC 516 can be initialized (606). In some embodiments, the microprocessor 518 can be actuated to provide a voltage of 10 VDC to the damper 506, i.e., the microprocessor 518 sets the damper voltage $V_D$=10 VDC (608). It should be understood that in some embodiments, the voltage provided to the damper 506 can vary. The position of the damper 506 can then be checked by the system 600 (610). For example, the system 600 can determine whether the damper 506 is in a fully open position (612). If the damper 506 is not in a fully open position, the system 600 can actuate the damper 506 into the fully open position and can check the damper 506 position again (614). If the damper 506 is in a fully open position, the system 600 can actuate a light-emitting diode (LED) in a graphical user interface, e.g., an interface visible to the user from the outside of the cabinet 502, to indicate that the damper 506 is in a fully open position (616). In some embodiments, rather than or in combination with an LED, the system 600 can indicate that the damper 506 is in a fully open position via alternative visual and/or auditory means, e.g., a signal.

Based on one or more signals received from the sensor 510, the system 600 can calculate a change in pressure $P_A$ and/or temperature $T_A$ within the cabinet 502 (618). For example, as the damper 506 is positioned in a fully open position, a change in pressure $P_A$ and/or temperature $T_A$ within the cabinet 502 can be calculated based on a signal received by the microprocessor 518 from a sensor 510 positioned on the inside of the cabinet 502 and a sensor 510 positioned on the outside of the cabinet 502. The system 600 can then check for errors with respect to calculation of a change in pressure $P_A$ and/or temperature $T_A$ within the cabinet 502 (620, 622). If an error occurs, the error can be displayed on a graphical user interphase, e.g., a visual and/or auditory indicator, a computer, and the like (624). Once the error has been resolved by the user, the system 600 can again calculate a change in pressure $P_A$ and/or temperature $T_A$ within the cabinet 502. If no errors occur in the calculation of the change in pressure $P_A$ and/or temperature $T_A$ within the cabinet 502, the system 600 can implement the algorithms discussed below to control the chimney assembly 504 airflow metric. In particular, the system 600 can determine whether the change in pressure $P_A$ and/or temperature $T_A$ is greater than or equal to a predetermined property value $\phi$ (626). For example, the predetermined property value $\phi$ can represent a manufacturer's recommended pressure and/or temperature for the equipment inside the cabinet 502.

If the change in pressure $P_A$ and/or temperature $T_A$ within the cabinet 502 is not greater than or equal to the predetermined property value $\phi$, i.e., the pressure $P_A$ and/or temperature $T_A$ is less than the predetermined property value $\phi$, the system 600 can determine whether the damper 506 is in a fully closed position (628). An indication that the change in pressure $P_A$ and/or temperature $T_A$ within the cabinet 502 is less than the predetermined property value $\phi$ generally indicates that the cabinet 502 is being sufficiently cooled or overcooled relative to the desired pressure or temperature for the equipment. If the damper 506 is fully closed, the system 600 can actuate an LED in a graphical user interface to indicate to the user that the damper 506 is in a fully closed position (630). The system 600 can then recalculate the change in pressure $P_A$ and/or temperature $T_A$ within the cabinet 502 to determine the status of the change in pressure $P_A$ and/or temperature $T_A$ relative to the predetermined property value $\phi$ (618). If the damper 506 is not in a fully closed position, i.e., fully open or partially open, the damper 506 can be actuated to fully close (632). For example, the damper 506 can be actuated into a fully closed position to prevent the equipment within the cabinet 502 from being overcooled. By actuating the damper 506 into a fully closed position, the pressure or temperature in the cabinet 502 can increase until the predetermined property value $\phi$ has been reached. In some embodiments, rather than fully closing the damper 506, the damper 506 can be actuated to a partially open position at an angle of opening less than the previous angle of opening. The system 600 can further recalculate the change in pressure $P_A$ and/or temperature $T_A$ within the cabinet 502 to determine the status of the change in pressure $P_A$ and/or temperature $T_A$ relative to the predetermined property value $\phi$ (618).

If the change in pressure $P_A$ and/or temperature $T_A$ within the cabinet 502 is greater than or equal to the predetermine property value $\phi$, the system 600 can check the damper 506 position to determine if the damper 506 should be regulated to bring the pressure $P_A$ and/or temperature $T_A$ within the cabinet 502 below the predetermined property value $\phi$ (634). For example, the system 600 can determine if the damper 506 is in a fully open position (636). If the damper 506 is fully open and the change in pressure $P_A$ and/or temperature $T_A$ within the cabinet 502 is still above the predetermined property value $\phi$, an LED indicating that the damper 506 is in the fully open position can be actuated (638). The system 600 can then recalculate the change in pressure $P_A$ and/or temperature $T_A$ within the cabinet 502 to determine the status of the change in pressure $P_A$ and/or temperature $T_A$ relative to the predetermined property value $\phi$ (618).

If the damper 506 is not in a fully open position, the system 600 can determine whether the change in pressure $P_A$ and/or temperature $T_A$ within the cabinet 502 is equal to the predetermined property value $\phi$ (640). If the change in pressure $P_A$ and/or temperature $T_A$ within the cabinet 502 is equal to the predetermined property value $\phi$, an LED can be actuated to indicate the set position of the damper 506 (642). For example, the LED can indicate the degree to which the damper 506 is partially open. The system 600 can then recalculate the change in pressure $P_A$ and/or temperature $T_A$ within the cabinet 502 to determine the status of the change in pressure $P_A$ and/or temperature $T_A$ relative to the predetermined property value $\phi$ (618). Thus, the user can be notified that the pressure or temperature in the cabinet 502 is at the desired predetermined property value $\phi$ and the damper 506 has been maintained in the current position until the pressure or temperature in the cabinet 502 increases or decreases.

If the change in pressure $P_A$ and/or temperature $T_A$ within the cabinet 502 is not equal to the predetermined property value ϕ, i.e., the change in pressure $P_A$ and/or temperature $T_A$ is greater than the predetermined property value ϕ, the damper 506 can be actuated to open at a greater angle (644). For example, the damper 506 can be actuated to open at an angle between the partially open position and the fully open position. As discussed above, in some embodiments, the damper 506 can be actuated via a motor drive and/or a contractible wire with a variable voltage applied to the wire. Thus, the position of the damper 506 can be regulated to increase the amount of ventilation within the cabinet 502 to decrease the pressure or temperature within the cabinet 502. It should be understood that an increase in the amount of ventilation is desired to maintain the pressure or temperature within the cabinet 502 at approximately the predetermined property value ϕ. Therefore, once the damper 506 has been repositioned to open at a greater angle, the system 600 can recalculate the change in pressure $P_A$ and/or temperature $T_A$ within the cabinet 502 to determine the status of the change in pressure $P_A$ and/or temperature $T_A$ relative to the predetermined property value ϕ (618). The damper 506 can then be regulated as needed to reach the predetermined property value ϕ.

It should be understood that if the system 600 fails at any time for any reason, the damper 506 can be automatically actuated into a fully open position, i.e., a default position, to ensure that the temperature and/or pressure within the cabinet 502 does not exceed to a point of damaging the equipment within the cabinet 502. Although discussed herein as a change in pressure $P_A$ and/or temperature $T_A$ within the cabinet 502, in some embodiments, the implementation of the system 600 can be based on one sensor positioned within the cabinet 502. Thus, rather than calculating a pressure and/or temperature differential, the actions of the system 600 can be performed based on a pressure and/or temperature value within the cabinet 502.

Figure 7:
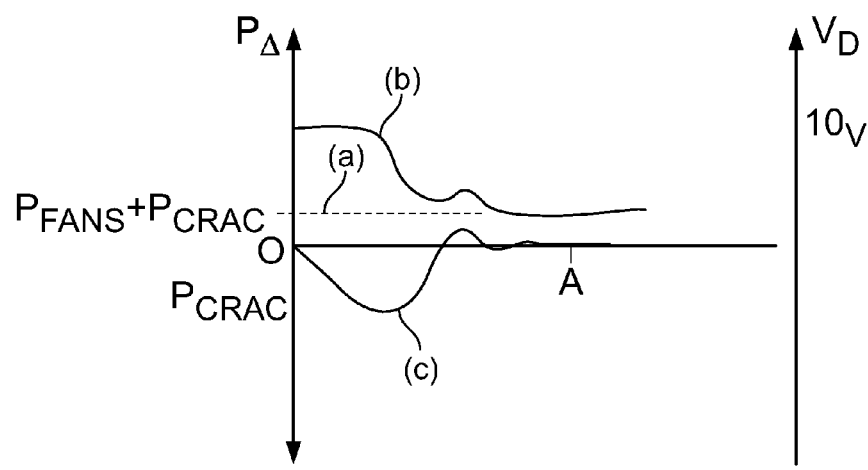
FIG. 7 shows a chart of pressure versus damper control voltage of an exemplary embodiment of a cabinet and a cooling unit with an exemplary ventilating system including a damper.

With reference to FIG. 7, a chart showing an exemplary change in pressure $P_A$ with respect to voltage input $V_D$ for damper 506 control is provided. Although discussed herein as a change in pressure $P_A$, it should be understood that a substantially similar chart can represent the change in temperature $T_A$ with respect to voltage input $V_D$ for damper 506 control. In particular, curve (a) indicates the desired pressure designated by a manufacturer at which the electrical equipment and fans should operate in combination for the maximum efficiency, e.g., the predetermined property value ϕ. Curve (a) can therefore be represented as $P_{FANS}+P_{CRAC}$, i.e., pressure for the fans and pressure for the computer room air conditioning unit in combination. As discussed above, it is generally desired to reduce or increase the pressure in the cabinet 502 to the position of curve (a) to maintain the equipment inside the cabinet 502 at the highest efficiency.

Curve (b) of FIG. 7 represents the change in pressure $P_A$ as the damper 506 is regulated by increasing or decreasing the voltage input $V_D$ between, for example, 0 VDC and 10 VDC. As discussed above, regulation of the damper 506 can be performed via, e.g., a motor drive, a contractible wire, and the like. The change in pressure $P_A$ in the cabinet 502 can fluctuate as regulation of the damper 506 increases or decreases the airflow within the cabinet 502, gradually stabilizing the pressure $P_A$ in the cabinet 502 at point A at a value substantially equal to the predetermined pressure value, i.e., curve (a).

Curve (c) of FIG. 7 represents the pressure $P_{CRAC}$ at which the CRAC unit operates over the manufacturer's suggested pressure as the damper 506 is regulated and the pressure $P_A$ in the cabinet 502 is gradually stabilized at the ideal cabinet 502 pressure. It should be understood that if the ideal operating pressure for the fans and the CRAC unit in combination is maintained, the pressure $P_{CRAC}$ can be at substantially 0. As can be seen from FIG. 7, when the pressure $P_A$ in the cabinet 502 is initially high, the pressure $P_{CRAC}$ for the CRAC unit can also be high. As the pressure $P_A$ in the cabinet 502 is reduced to and approaches curve (a), the pressure $P_{CRAC}$ can gradually stabilize at point A at a value substantially equal to 0. Once the ideal pressure for the cabinet 502 has been reached, the damper 506 can be regulated by the system 600 to ensure that the pressure $P_A$ does not substantially deviate from the pressure $P_{FANS}+P_{CRAC}$.

Experimentation of actuation of a damper 506 was performed with a prototype damper 506 actuated by a contractible wire, e.g., a FLEXINOL® wire, by providing a wire voltage and a wire current to the wire. Table 1, below, shows the data collected for data points 1-22, including a damper 506 opening measured in inches with a caliper between the blades of the damper 506, a wire voltage measured in voltage direct current (VDC), and a wire current measured in Amperes (A). A resistance in Ohms was then calculated for each data point.

TABLE 1

FLEXINOL ® Wire Actuation of a Damper

| Data Point | Damper Opening (in) | Wire Voltage (VDC) | Wire Current (A) | Wire Resistance (Ohm) |
| --- | --- | --- | --- | --- |
| 1 | 0.000 | 3.50 | 1.08 | 3.500 |
| 2 | 0.135 | 2.09 | 0.60 | 3.483 |
| 3 | 0.347 | 1.89 | 0.50 | 3.780 |
| 4 | 0.480 | 1.74 | 0.45 | 3.867 |
| 5 | 0.550 | 1.44 | 0.35 | 4.110 |
| 6 | 0.580 | 1.03 | 0.25 | 4.120 |
| 7 | 0.620 | 0.59 | 0.15 | 3.930 |
| 8 | 0.630 | 0.00 | 0.00 | 0.000 |
| 9 | 0.600 | 0.64 | 0.15 | 4.270 |
| 10 | 0.600 | 0.95 | 0.25 | 3.800 |
| 11 | 0.620 | 1.30 | 0.35 | 3.710 |
| 12 | 0.620 | 1.69 | 0.45 | 3.750 |
| 13 | 0.590 | 1.87 | 0.50 | 3.740 |
| 14 | 0.590 | 2.40 | 0.60 | 4.000 |
| 15 | 0.530 | 2.70 | 0.70 | 3.860 |
| 16 | 0.160 | 2.75 | 0.80 | 3.440 |
| 17 | 0.020 | 2.90 | 0.90 | 3.190 |
| 18 | 0.000 | 3.44 | 1.08 | 3.160 |

With respect to the data in Table 1, for data points 1-8, the wire current was decreased and the wire voltage was set to a maximum of approximately 3.50 VDC. At the maximum current of approximately 1.08 A and the maximum voltage of approximately 3.50 VDC, the wire remained at the maximum contraction, thereby positioning the damper 506 in a fully closed position. In some embodiments, the maximum contraction of the wire can be approximately 4% of the original wire length. As the wire current was decreased to approximately 0 for data points 1-8, the wire was expanded which, in turn, actuated the damper 506 opening to increase from approximately 0 inches to approximately 0.63 inches.

For data points 8-18, the wire current was increased from approximately 0 A to approximately 1.08 A and the voltage was increased from approximately 0 VDC to a maximum of approximately 3.50 VDC. As the wire current was increased, the expansion of the wire was reduced, i.e., the wire was contracted, until the damper 506 opening was reduced back to a fully closed position. It should be understood that the exemplary data provided in Table 1 should not be construed as limiting and, in some embodiments, the current and/or voltage applied to the contractible wire can be greater than or less than the current and/or voltage shown in Table 1 to increase or decrease the damper 506 opening. Similarly, rather than increasing the wire voltage and current to close the damper 506, in some embodiments, the damper 506 can be closed by decreasing the wire voltage and current.

Figure 8A:
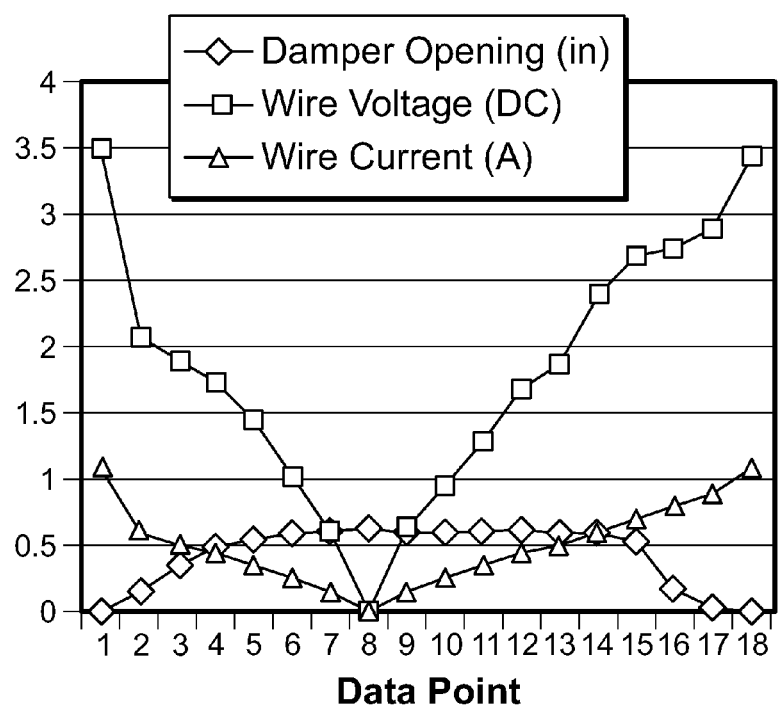
FIGS. 8A-8C show charts of actuation of a damper in an exemplary ventilating system.
Figure 8B:
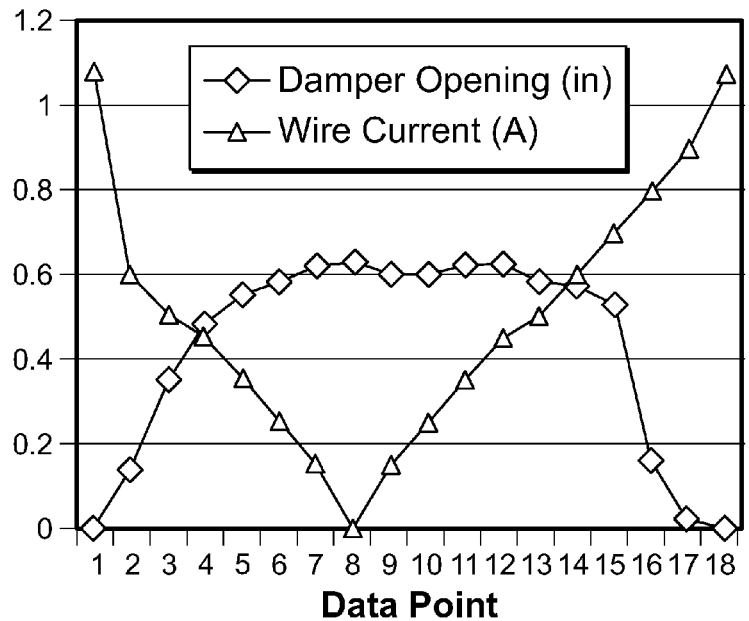
Figure 8C:
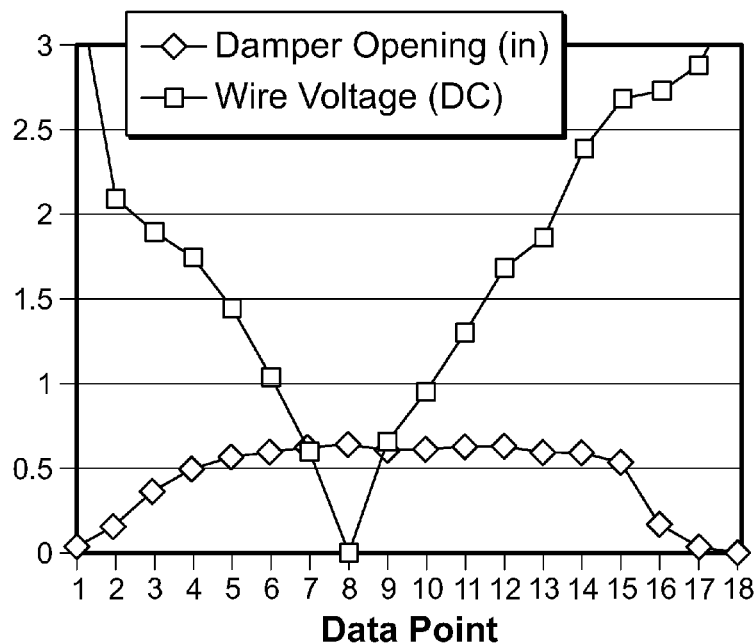

FIGS. 8A-8C are charts illustrating the data points of Table 1. In particular, FIG. 8A illustrates the data points for the damper 506 opening, the wire voltage and the wire current as the damper 506 is actuated into a closed and open position by varying the current and/or voltage applied to the contractible wire, FIG. 8B illustrates the data points for the damper 506 opening and the wire current applied to the contractible wire, and FIG. 8C illustrates the data points for the damper 506 opening and the wire voltage applied to the contractible wire. Thus, in some embodiments, as the voltage and/or current applied to the contractible wire is reduced, the damper 506 opening can be increased. It should be understood that if the control system 500 fails at any time for any reason, voltage and/or current will not be applied to the contractible wire, thereby expanding the wire to a maximum length which, in turn, can actuate the damper 506 into a fully open position, i.e., a default position, to ensure that the temperature and/or pressure within the cabinet 502 does not exceed to a point of damaging the equipment within the cabinet 502.

The experimentation discussed above demonstrated that the FLEXINOL® wire may become heated when the voltage is applied and further cools when the voltage is removed. It was noted that the time lapse in the cooling process of the contractible wire may create hysteresis in the mechanical linkage and/or spring associated with the contractible wire which positions the damper 506 into an open, a partially open or a closed position. However, the hysteresis created, if any, generally does not affect the operation of the control system 600. In particular, as discussed above, the microprocessor 518 continuously calculates and monitors the change between the ambient pressure and/or temperature outside of the cabinet 502 and the pressure and/or temperature in the rear of the cabinet 502. The calculated difference in pressure and/or temperature can be further used by the microprocessor 518 to adjust the position of the damper 506 to maintain the ideal pressure and/or temperature of the cabinet 502, e.g., a "zero" air pressure and/or temperature position, with a specific or predetermined tolerance. The continuous monitoring of the pressure and/or temperature and regulation of the damper 506 acts as a self-correcting function of the system 600 which can appropriately adjust the position of the damper 506 as the contractible wire cools. Thus, the hysteresis created, if any, generally does not affect the operation of the system 600.

In some embodiments, the cabinet 202' to which the chimney assembly 204' attaches can include vertically split side/divider panels. In embodiments where the cabinets 202' are bayed together (e.g., FIG. 2B), the rear side/divider panels can be removed such that the rear of the cabinets 202' can advantageously act as a common return plenum. For example, the creation of a common return plenum at the rear of the bayed cabinets 202' may promote equal pressure distribution within the row of cabinets 202', promote equal temperature distribution within the row of cabinets 202', and/or allow cable management between the cabinets 202' without the need to exit the individual cabinets 202' or without the need for opening a side/divider panel each time a cable passage is desired. For example, passage of cables directly through the row of cabinets 202' can act as a security measure to ensure that the cables cannot be disconnected or damaged from the outside of the cabinet 202'. In some embodiments, front-to-real airflow can be maintained within the cabinets 202' by installing front divider/side panels.

In addition, recirculation of the hot exhaust air from the equipment located inside the cabinets 202' to the intake of the equipment can be prevented with integrated cabinet design sealing, blanking panels and/or air dam kits. A common return plenum located in the rear of the cabinets 202' can allow the end user to place a chimney assembly 204' on, e.g., each cabinet 202', every other cabinet 202', sporadically in the row of cabinets 202' as needed, and the like. Depending on the number and frequency of the chimney assemblies 204' utilized, the spacing of the chimney assemblies 204' can be determined to allow for spray patterns of fire suppression devices to function as required to meet the applicable fire codes. For example, the spacing of the chimney assemblies 204' can be selected such that the requisite distance surrounding each fire suppression equipment nozzle is permitted.

Removing the rear side/divider panels can also allow a redundancy of the exemplary cooling solution. For example, if one damper 210' fails within the row of bayed cabinets 202', the common return plenum located in the rear of the cabinets 202' can allow the heat load to be distributed to the remaining chimney assemblies 204' via the open pathway between the cabinets 202', while maintaining the front-to-rear airflow with the front side/divider panels installed. Thus, rather than overheating due to the failed damper 210', the common return plenum can assist in maintaining the desired temperature, pressure and/or airflow within the cabinets 202'.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. A ventilating system for regulating a property of an electrical equipment cabinet located within an enclosure, comprising:
   a duct configured and dimensioned to be mounted to the electrical equipment cabinet;
   a damper mounted to the duct;
   a first sensor mounted within the electrical equipment cabinet, the first sensor being effective to generate signals related to a property within the electrical equipment cabinet;
   a second sensor mounted to an outside of the electrical equipment cabinet, the second sensor being effective to generate signals related to a property outside of the electrical equipment cabinet and within the enclosure; and
   an actuating mechanism configured and dimensioned to control a position of the damper based on a difference between the generated signals related to the property within the electrical equipment cabinet and the generated signals related to the property outside of the electrical equipment cabinet and within the enclosure, the actuating mechanism controlling the position of the damper when the difference between the generated signals reaches a predetermined value and until the difference reaches a baseline setting;

wherein the actuating mechanism includes a contractible and expandable wire.

2. The ventilating system according to claim 1, wherein a mounting position of the duct and the damper on a top wall of the electrical equipment cabinet is variably adjustable.

3. The ventilating system according to claim 1, comprising a duct extension mounted to the duct.

4. The ventilating system according to claim 1, wherein the duct is configured and dimensioned to be mounted to a return plenum.

5. The ventilating system according to claim 1, wherein each of the first sensor and the second sensor is at least one of a temperature sensor, a pressure sensor, an airflow sensor, and a transducer.

6. The ventilating system according to claim 5, wherein the property within the electrical equipment cabinet and the property outside of the electrical equipment cabinet is at least one of a temperature, a pressure, and an airflow.

7. The ventilating system according to claim 1, wherein controlling the position of the damper is effective to maintain a substantially zero pressure or temperature differential environment in the electrical equipment cabinet.

8. The ventilating system according to claim 1, wherein the actuating mechanism is a pressure switch, or a mechanical drive.

9. The ventilating system according to claim 1, wherein the damper is a variable damper.

10. A method for regulating a property of an electrical equipment cabinet located within an enclosure with a ventilating system, comprising:

mounting a duct to the electrical equipment cabinet;

mounting a damper to the duct;

mounting a first sensor within the electrical equipment cabinet, the first sensor being effective to generate signals related to a property within the electrical equipment cabinet;

mounting a second sensor to an outside of the electrical equipment cabinet, the second sensor being effective to generate signals related to a property outside of the electrical equipment cabinet and within the enclosure;

sensing the property within the electrical equipment cabinet and outside of the electrical equipment cabinet and within the enclosure based on the signals generated by the first and second sensors;

providing an actuating mechanism configured and dimensioned to control a position of the damper based on a difference between the generated signals related to the property within the electrical equipment cabinet and the generated signals related to the property outside of the electrical equipment cabinet and within the enclosure; and controlling the position of the damper, via the actuating mechanism, based on the difference between the generated signals related to the property within the electrical equipment cabinet and the generated signals related to the property outside of the electrical equipment cabinet and within the enclosure;

wherein the actuating mechanism controls the position of the damper when the difference between the generated signals reaches a predetermined value and until the difference reaches a baseline setting; and wherein the actuating mechanism includes a contractible and expandable wire.

11. The method according to claim 10, wherein the actuating mechanism is a pressure switch, or a mechanical drive.

12. The method according to claim 10, comprising providing a voltage to the contractible and expandable wire to regulate the position of the damper.

13. The method of claim 10, wherein controlling the position of the damper is effective to maintain a substantially zero pressure or temperature differential environment inside the electrical equipment cabinet.

14. The method of claim 10, comprising removing one or more side or divider panels of the electrical equipment cabinet to create a common return plenum to equalize temperature or pressure within the electrical equipment cabinet.

* * * * *